(12) United States Patent
Wang et al.

(10) Patent No.: US 9,139,906 B2
(45) Date of Patent: Sep. 22, 2015

(54) DOPING WITH ALD TECHNOLOGY

(75) Inventors: Chang-Gong Wang, Chandler, AZ (US); Eric Shero, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 1498 days.

(21) Appl. No.: 12/038,764

(22) Filed: Feb. 27, 2008

(65) Prior Publication Data
US 2009/0214767 A1    Aug. 27, 2009

(51) Int. Cl.
| | | |
|---|---|---|
| *B05D 5/12* | (2006.01) | |
| *C23C 16/455* | (2006.01) | |
| *H01L 21/28* | (2006.01) | |
| *H01L 21/3115* | (2006.01) | |
| *H01L 21/314* | (2006.01) | |
| *H01L 29/49* | (2006.01) | |
| *H01L 29/51* | (2006.01) | |
| *H01L 21/316* | (2006.01) | |

(52) U.S. Cl.
CPC .... *C23C 16/45534* (2013.01); *H01L 21/28088* (2013.01); *H01L 21/28194* (2013.01); *H01L 21/3115* (2013.01); *H01L 21/3141* (2013.01); *H01L 21/31641* (2013.01); *H01L 21/31645* (2013.01); *H01L 29/4966* (2013.01); *H01L 29/518* (2013.01); *H01L 21/3143* (2013.01); *H01L 21/3162* (2013.01)

(58) Field of Classification Search
USPC ....................................... 427/126.1
See application file for complete search history.

(56) References Cited

U.S. PATENT DOCUMENTS

| | | | |
|---|---|---|---|
| 3,405,801 A | 10/1968 | Zwiacher et al. | |
| 4,058,430 A | 11/1977 | Suntola et al. | |
| 4,477,296 A | 10/1984 | Nair | |
| 4,486,487 A | 12/1984 | Skarp | |
| 4,747,367 A | 5/1988 | Posa | |
| 4,761,269 A | 8/1988 | Conger et al. | |
| 5,071,670 A | 12/1991 | Kelly | |
| 5,291,066 A | 3/1994 | Neugebauer | |
| 5,306,666 A | 4/1994 | Izumi | |
| 5,320,719 A | 6/1994 | Lasbmore et al. | |
| 5,372,962 A | 12/1994 | Hirota et al. | |
| 5,382,333 A | 1/1995 | Ando et al. | |

(Continued)

FOREIGN PATENT DOCUMENTS

| | | |
|---|---|---|
| DE | 410873 | 8/1923 |
| EP | 0469470 | 2/1992 |

(Continued)

OTHER PUBLICATIONS

Shimamoto et al. (Advantages of gate work-function engineering by incorporating sub-monolayer Hf at SiON/poly-Si interface in low-power CMOS) (2005).*

(Continued)

*Primary Examiner* — Austin Murata

(74) *Attorney, Agent, or Firm* — Knobbe, Martens, Olson & Bear LLP

(57) ABSTRACT

Methods for doping a substrate surface or the interface between two thin films by atomic layer deposition process (ALD) are provided. By blocking some of the available binding sites for a dopant precursor with a blocking reactant, the concentration and uniformity of dopant deposited can be controlled. The blocking reactant may be introduced prior to introduction of the dopant precursor in the ALD process, or the blocking reactant and the dopant precursor can be introduced simultaneously.

30 Claims, 3 Drawing Sheets

(56) References Cited

U.S. PATENT DOCUMENTS

| | | | |
|---|---|---|---|
| 5,449,314 A | 9/1995 | Meikle et al. |
| 5,453,494 A | 9/1995 | Kirlin et al. |
| 5,610,106 A | 3/1997 | Foster et al. |
| 5,625,217 A | 4/1997 | Chau et al. |
| 5,711,811 A | 1/1998 | Suntola |
| 5,731,634 A | 3/1998 | Matsuo et al. |
| 5,769,950 A | 6/1998 | Takasu et al. |
| 5,783,478 A | 7/1998 | Chau et al. |
| 5,795,495 A | 8/1998 | Meikle |
| 5,865,365 A | 2/1999 | Nishikawa et al. |
| 5,916,365 A | 6/1999 | Sherman |
| 5,939,334 A | 8/1999 | Nguyen et al. |
| 6,006,763 A | 12/1999 | Mori et al. |
| 6,033,584 A | 3/2000 | Ngo et al. |
| 6,066,533 A | 5/2000 | Yu |
| 6,066,892 A | 5/2000 | Ding et al. |
| 6,090,666 A | 7/2000 | Ueda et al. |
| 6,124,189 A | 9/2000 | Watanabe et al. |
| 6,130,123 A | 10/2000 | Liang et al. |
| 6,153,935 A | 11/2000 | Edelstein et al. |
| 6,166,417 A | 12/2000 | Bai et al. |
| 6,174,799 B1 | 1/2001 | Lopatin et al. |
| 6,174,809 B1 | 1/2001 | Kang et al. |
| 6,200,893 B1 | 3/2001 | Sneh |
| 6,225,168 B1 | 5/2001 | Gardner et al. |
| 6,265,258 B1 | 7/2001 | Liang et al. |
| 6,291,282 B1 | 9/2001 | Wilk et al. |
| 6,294,836 B1 | 9/2001 | Paranjpe et al. |
| 6,303,500 B1 | 10/2001 | Jiang et al. |
| 6,323,131 B1 | 11/2001 | Obeng et al. |
| 6,329,704 B1 | 12/2001 | Akatsu et al. |
| 6,342,277 B1 | 1/2002 | Sherman |
| 6,346,151 B1 | 2/2002 | Jiang et al. |
| 6,362,526 B1 | 3/2002 | Pramanick et al. |
| 6,365,502 B1 | 4/2002 | Paranjpe et al. |
| 6,368,954 B1 | 4/2002 | Lopatin et al. |
| 6,368,961 B1 | 4/2002 | Lopatin et al. |
| 6,373,111 B1 | 4/2002 | Zheng et al. |
| 6,383,879 B1 | 5/2002 | Kizilyalli et al. |
| 6,399,522 B1 | 6/2002 | Tsan et al. |
| 6,407,435 B1 | 6/2002 | Ma et al. |
| 6,433,432 B2 | 8/2002 | Shimizu |
| 6,444,868 B1 | 9/2002 | Vaughn et al. |
| 6,458,695 B1 | 10/2002 | Lin et al. |
| 6,482,262 B1 | 11/2002 | Elers et al. |
| 6,482,740 B2 | 11/2002 | Soininen et al. |
| 6,506,676 B2 | 1/2003 | Park et al. |
| 6,511,876 B2 | 1/2003 | Buchanan et al. |
| 6,518,106 B2 | 2/2003 | Ngai et al. |
| 6,534,395 B2 | 3/2003 | Werkhoven et al. |
| 6,537,901 B2 | 3/2003 | Cha et al. |
| 6,548,886 B1 | 4/2003 | Ikari et al. |
| 6,551,893 B1 | 4/2003 | Zheng et al. |
| 6,579,767 B2 | 6/2003 | Park et al. |
| 6,596,576 B2 | 7/2003 | Fu et al. |
| 6,613,695 B2 | 9/2003 | Pomarede et al. |
| 6,627,503 B2 | 9/2003 | Ma et al. |
| 6,686,271 B2 | 2/2004 | Raaijmakers et al. |
| 6,696,332 B2 | 2/2004 | Visokay et al. |
| 6,700,771 B2 | 3/2004 | Bhattacharyya |
| 6,703,708 B2 | 3/2004 | Werkhoven et al. |
| 6,709,989 B2 | 3/2004 | Ramdani et al. |
| 6,713,846 B1 | 3/2004 | Senzaki |
| 6,714,435 B1 | 3/2004 | Dimmler et al. |
| 6,717,226 B2 | 4/2004 | Hegde et al. |
| 6,723,581 B1 | 4/2004 | Chabal et al. |
| 6,730,163 B2 | 5/2004 | Vaarstra |
| 6,730,588 B2 | 5/2004 | Schinella |
| 6,780,704 B1 | 8/2004 | Raaijmakers et al. |
| 6,800,552 B2 | 10/2004 | Elers et al. |
| 6,815,354 B2 | 11/2004 | Uzoh et al. |
| 6,824,816 B2 | 11/2004 | Aaltonen et al. |
| 6,852,635 B2 | 2/2005 | Satta et al. |
| 6,858,524 B2 | 2/2005 | Haukka et al. |
| 6,921,712 B2 | 7/2005 | Soininen et al. |
| 6,933,225 B2 | 8/2005 | Werkhoven et al. |
| 6,955,986 B2 | 10/2005 | Li |
| 6,986,914 B2 | 1/2006 | Elers et al. |
| 7,045,406 B2 | 5/2006 | Huotari et al. |
| 7,105,054 B2 | 9/2006 | Lindfors |
| 7,108,747 B1 | 9/2006 | Leskela et al. |
| 7,118,779 B2 | 10/2006 | Verghese et al. |
| 7,438,949 B2 | 10/2008 | Weidman |
| 7,491,634 B2 | 2/2009 | Huotari et al. |
| 2001/0003064 A1 | 6/2001 | Ohto |
| 2001/0018266 A1 | 8/2001 | Jiang et al. |
| 2001/0025999 A1 | 10/2001 | Suguro |
| 2001/0041250 A1* | 11/2001 | Werkhoven et al. ........ 428/212 |
| 2001/0052318 A1 | 12/2001 | Jiang et al. |
| 2002/0006468 A1 | 1/2002 | Paranjpe et al. |
| 2002/0008257 A1 | 1/2002 | Barnak et al. |
| 2002/0013487 A1 | 1/2002 | Norman et al. |
| 2002/0014634 A1 | 2/2002 | Koyama et al. |
| 2002/0027286 A1 | 3/2002 | Sundararajan et al. |
| 2002/0030235 A1 | 3/2002 | Agarwal et al. |
| 2002/0037615 A1 | 3/2002 | Matsuo |
| 2002/0096724 A1 | 7/2002 | Liang et al. |
| 2002/0102838 A1 | 8/2002 | Paranjpe et al. |
| 2002/0106536 A1 | 8/2002 | Lee et al. |
| 2002/0137317 A1 | 9/2002 | Kaushik et al. |
| 2002/0190302 A1 | 12/2002 | Bojarczuk et al. |
| 2003/0032281 A1 | 2/2003 | Werkhoven et al. |
| 2003/0049942 A1 | 3/2003 | Haukka et al. |
| 2003/0064607 A1 | 4/2003 | Leu et al. |
| 2003/0072975 A1 | 4/2003 | Shero et al. |
| 2003/0082296 A1 | 5/2003 | Elers et al. |
| 2003/0165615 A1 | 9/2003 | Aaltonen et al. |
| 2003/0201537 A1 | 10/2003 | Lane et al. |
| 2003/0232510 A1 | 12/2003 | Buchanan et al. |
| 2004/0005753 A1 | 1/2004 | Kostamo et al. |
| 2004/0023516 A1* | 2/2004 | Londergan et al. ........ 438/785 |
| 2004/0036129 A1 | 2/2004 | Forbes et al. |
| 2004/0071878 A1 | 4/2004 | Schuhmacher |
| 2004/0106261 A1 | 6/2004 | Huotari et al. |
| 2004/0121616 A1 | 6/2004 | Satta et al. |
| 2004/0175928 A1 | 9/2004 | Abell |
| 2004/0214354 A1 | 10/2004 | Marsh et al. |
| 2004/0256662 A1 | 12/2004 | Black et al. |
| 2005/0009325 A1 | 1/2005 | Chung et al. |
| 2005/0045092 A1 | 3/2005 | Wu et al. |
| 2005/0048794 A1 | 3/2005 | Brask et al. |
| 2005/0089632 A1 | 4/2005 | Vehkamaki et al. |
| 2005/0092247 A1 | 5/2005 | Schmidt et al. |
| 2005/0145956 A1* | 7/2005 | Wang et al. ............... 257/410 |
| 2005/0212139 A1 | 9/2005 | Leinikka |
| 2005/0263803 A1 | 12/2005 | Takayanagi |
| 2005/0271812 A1 | 12/2005 | Myo et al. |
| 2005/0271813 A1* | 12/2005 | Kher et al. ............ 427/248.1 |
| 2005/0277294 A1* | 12/2005 | Schaeffer et al. ......... 438/680 |
| 2006/0046384 A1 | 3/2006 | Joo et al. |
| 2006/0078679 A1 | 4/2006 | Elers et al. |
| 2006/0121733 A1 | 6/2006 | Kilpela et al. |
| 2006/0128168 A1* | 6/2006 | Ahn et al. ................. 438/800 |
| 2006/0216932 A1 | 9/2006 | Kumar et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0128858 A1 | 6/2007 | Haukka et al. |
| 2007/0148347 A1 | 6/2007 | Hatanpaa et al. |
| 2007/0232501 A1* | 10/2007 | Tonomura ................ 505/473 |
| 2007/0249182 A1* | 10/2007 | Mani et al. ............... 438/785 |
| 2008/0020593 A1* | 1/2008 | Wang et al. .............. 438/782 |
| 2008/0085610 A1 | 4/2008 | Wang et al. |
| 2009/0050982 A1* | 2/2009 | Pantisano et al. .......... 257/411 |

FOREIGN PATENT DOCUMENTS

| | | |
|---|---|---|
| EP | 0511264 | 8/1995 |
| EP | 0854505 | 7/1998 |
| EP | 0880168 | 11/1998 |
| EP | 1063687 | 12/2000 |
| GB | 2340508 | 2/2000 |
| GB | 2372042 | 8/2002 |
| GB | 2372043 | 8/2002 |

(56) References Cited

FOREIGN PATENT DOCUMENTS

| | | |
|---|---|---|
| GB | 2372044 | 8/2002 |
| JP | 2000-058777 | 2/2000 |
| WO | WO 93/10652 | 5/1993 |
| WO | WO 94/14198 | 6/1994 |
| WO | WO 00/03420 | 1/2000 |
| WO | WO 00/47404 | 8/2000 |
| WO | WO 00/47796 | 8/2000 |
| WO | WO 00/54320 | 9/2000 |
| WO | WO 00/61833 | 10/2000 |
| WO | WO 01/29280 | 4/2001 |
| WO | WO 01/29892 | 4/2001 |
| WO | WO 01/29893 | 4/2001 |
| WO | WO 01/40541 | 7/2001 |
| WO | WO 01/66832 | 9/2001 |
| WO | WO 01/99166 | 12/2001 |
| WO | WO 02/43115 | 5/2002 |
| WO | WO 02/50922 | 6/2002 |
| WO | WO 2004/064147 | 7/2004 |
| WO | WO 2004/114398 | 12/2004 |
| WO | WO 2005/113852 | 12/2005 |
| WO | WO 2005/113855 | 12/2005 |
| WO | WO 2005/117086 | 12/2005 |
| WO | WO 2006/091510 | 8/2006 |
| WO | WO 2007/043709 | 4/2007 |
| WO | WO 2008/011235 | 1/2008 |
| WO | WO 2008/042981 | 4/2008 |

OTHER PUBLICATIONS

International Preliminary Examination Report dated Jul. 9, 2002, Application No. PCT/US01/06746.
International Search Report and Written Opinion dated Jul. 4, 2008, Application No. PCT/US2007/080342.
International Search Report and Written Opinion dated Jun. 28, 2006, Application No. PCT/US2006/005868.
U.S. Appl. No. 10/430,703, filed May 5, 2003; Office Action mailed Sep. 3, 2004 and Mar. 31, 2005.
U.S. Appl. No. 10/954,806, filed Sep. 29, 2004; Office Action mailed Nov. 15, 2005.
U.S. Appl. No. 11/294,843, filed Nov. 28, 2007; Office Action mailed Dec. 5, 2005, Aug. 22, 2008; Notice of Allowance mailed Mar. 25, 2009.
U.S. Appl. No. 11/414,510, filed Apr. 28, 2006; Office Action mailed Apr. 25, 2008; Notice of Allowance mailed Oct. 9, 2008.
U.S. Appl. No. 11/868,333, filed Oct. 5, 2007; Office Action mailed May 28, 2008, Jan. 15, 2009 and Jun. 1, 2009.
U.S. File History printed Jun. 26, 2009 for U.S. Appl. No. 09/800,757, filed Mar. 6, 2001, entitled "Method of Forming Graded Thin Films Using Alternating Pulses of Vapor Phase Reactants".
U.S. File History printed Jun. 26, 2009 for U.S. Appl. No. 11/294,843, filed Dec. 5, 2005, entitled "Method of Producing Thin Films".
U.S. File History printed Jun. 26, 2009 for U.S. Appl. No. 11/414,510, filed Apr. 28, 2006, entitled "Methods for Forming Roughened Surfaces and Applications Thereof".
U.S. File History printed Jun. 26, 2009 for U.S. Appl. No. 11/868,333, filed Oct. 5, 2007, entitled "ALD of Metal Silicate Films".
Atomic Layer Deposition Targets Thin Films, Wafer Processing, Semiconductor International, Sep. 1, 1999.
SOI Technology: IBM's Next Advance in Chip Design, 1998.
Aaltonen et al., Atomic Layer Deposition of Noble Metal Thin Films, dissertation presented at the University of Helsinki, 2005, Helsinki, Finland.
Aaltonen et al., Atomic Layer Deposition of Platinum Thin Films, Chem. Mater., 2003, vol. 15, pp. 1924-1928.
Abeles et al., Amorphous Semiconductor Superlattices, Physical Review Letters, Nov. 21, 1983, vol. 51, Issue 21, pp. 2003-2006.
Alén, Atomic Layer Deposition of TaN, NbN, and MoN Films for Cu Metallizations, Academic Dissertation, Jun. 22, 2005, Helsinki, Finland.
Alén et al., ALD of Ta(Si)n. Thin Films Using TDMAS as a Reducing Agent and as a Si Precursor, J. Electrochem. Soc., 2004, vol. 151, Issue 8, pp. G523-G527.
Bai, High K Gate Stack for Sub-0.1 UM CMOS Technology, Electrochemical Society Proceedings, 1999, vol. 99-100, pp. 39-44.
Baliga, J., New Designs and Materials Tackle 1 Gb Memory Challenge, Semiconductor International, Nov. 2000.
Basceri, C., Electrial Dielectric Properties of (Ba,Sr) $TiO_3$ Thin Film Capacitors for Ultra-High Density Dynamic Random Access Memories, Thesis, 1997.
Chatterjee et al., CMOS Metal Replacement Gate Transistors using Tantalum Pentoxide Gate Insulator, IEEE, IEDM, 0-7803-4774-9/98, 1998, pp. 777-780.
Chen et al., 0.18□m Metal Gate Fully-Depleted SOI MOSFETs for Advanced CMOS Applications, Symposium on VLSI Technology Digest of Technical Papers, 1999, pp. 25-26.
Del Prado, et al., Full composition range silicon oxynitride films deposited by ECR-PECVD at room temperature, Thin Solid Films, 1999, vol. 344, pp. 437-440.
Bai, High K Gate Stack for Sub-0.1 UM CMOS Technology, Electrochemical Society Proceedings, 1999, vol. 99-10, pp. 39-44.
Chen et al., 0.18□m Metal Gate Fully-Depleted SOI MOSFETs for Advanced CMOS Applications, Symposium on VLSI Technology Digest of Technical Papers, 1999, pp. 25-26.
Delabie A, et al., Atomic Layer Deposition of hafnium silicate gate dielectric layers, Journal of Vacuum Science & Technology A (Vacuum, Surfaces, and Films) AIP for American Vacuum SOC. USA, Jul. 2007, vol. 25, Issue 4, pp. 1302-1308.
Desu et al., Enhanced Dielectric Properties of Modified $Ta_2O_5$ Thin Films, Mat Res. Innovat, 1999, vol. 2, pp. 299-302.
Ducroquet et al., Full CMP Integration of CVD TiN Damascene Sub-0.1-□m Metal Gate Devices for ULSI Applications, IEEE Transactions on Electron Devices, 2001, vol. 48, Issue 8, pp. 1816-1821.
Duenas et al., Experimental investigation of the electrical properties of atomic layer deposited hafnium-rich silicate films on n-type silicon, Journal of Applied Physics, American Institute of Physics, Nov. 10, 2006, vol. 100, Issue 9, pp. 94107-1-94107-9, New York, US.
Elam et al., Surface Chemistry and Film Growth During TiN Atomic Layer Deposition Using TDMAT and $NH_3$, Thin Solid Films, 2003, vol. 436, pp. 145-156.
Fedorenko Y., et al., Atomic layer deposition of hafnium silicate from HfC14, SiC14, and H20, Electrochemical and Solid-State Letters Electrochem, SOC USA, May 5, 2007, vol. 10, Issue 5, pp. H149-H152.
Ferguson et al., Titanium Nitride Metal Gate Electrode: Effect of Nitrogen Incorporation, Advanced Metallization Conference 2001 (AMC 2001), 2001, pp. 115-119.
Ferguson et al., Atomic Layer Deposition of Boron Nitride Using a Sequential Exposures of $BCl_3$ and $NH_3$, Thin Solid Films, 2002, vol. 413, pp. 16-24.
Haukka and Root, The Reaction of Hexamethyldisilazane and Subsequent Oxidation of Trimethylsilyl Groups on Silica Studied by Solid-State NMR and FTIR, J. Phys. Chem., 1994, vol. 98, pp. 1695-1703.
Haukka et al., Chemisorption of Chromium Acetylacetonate on Porous High Surface Area Silica, Appl. Surface Science, 1994, vol. 75, pp. 220-227.
Hiltunen et al., Nitrides of Titanium, Niobium, Tantalum and Molybdenum Grown as Thin Films by the Atomic Layer Epitaxy Method, Thin Solid Films, 1988, vol. 166, pp. 149-154.
Hobbs et al., Sub-Quarter Micron CMOS Process for TiN-Gate MOSFETs with $TiO_2$ Gate Dielectric formed by Titanium Oxidation, Advanced Products Research and Development Lab, Symposium on VLSI Technology Digest of Technical Papers, 1999, pp. 133-134.
Hoyas et al., Growth and Characterization of Atomic Layer Deposited WCO.7NO.3 on Polymer Films, Journal of Applied Physics, Jan. 1, 2004, vol. 95, Issue 1, pp. 381-388.
Ihanus et al., ALE Growth of $ZnS_{1-x}Se_x$ Thin Films by Substrating Surface Sulfur with Elemental Selenium, Applied Surface Science, 1997, vol. 112, pp. 154-158.

(56) References Cited

OTHER PUBLICATIONS

Kaizuka et al., Conformal Chemical Vapor Deposition TiN (111) Film Formation as an Underlayer of Al for Highly Reliable Interconnects, jpn, J. Appl. Phys., 1994, vol. 33, pp. 470-474.

Kikkawa et al., A Quarter-Micrometer Interconnection Technology Using a TiN/Al—Si—Cu/TiN/Al—Si—Cu/TiN/Ti Multilayer Structure, IEEE Transactions on Electron Devices, Feb. 1993, vol. 40, Issue 2.

Kikkawa et al., Al—Si—Cu/TiN Multilayer Interconnection and Al—Ge Reflow Sputtering Technologies for Quarter-Micron Devices, Submicrometer Metallization, 1992, vol. 1805.

Kim et al., The Effects of Substrate and Annealing Ambient on the Electrical Properties of $Ta_2O_5$ Thin Films Prepared by Plasma Enhanced Chemical Vapor Deposition, Thin Film Solids, 1994, vol. 253, pp. 435-439.

Klaus et al., Atomic Layer Controlled Growth of $Si_3N_4$ Films Using Sequential Surface Reactions, Surf. Sci., 1998, vol. 418, pp. L14-L19.

Klaus et al., Atomic layer deposition of tungsten using sequential surface chemistry with a sacrificial stripping reaction, Thin Solid Films, 2000, vol. 360, pp. 145-153.

Koh et al., Meeting the Cu diffusion barrier challenge using ALD tungsten nitride carbide, Solid State Technology, Jun. 2005, pp. 54-58.

Kukli K. et al., Atomic Layer Epitaxy Growth of Tantalum Oxide Thin Films from Ta $(OC_2H_5)$ and $H_2O$, J. Electochem. Soc., May 1995, vol. 142, Issue 5, pp. 1670-1674.

Kukli K. et al., Properties of Oxide Film Atomic Layer Deposited from Tetraethoxy Silane, Hafnium Halides, and Water, Journal of the Electrochemical Society, Mar. 17, 2004, vol. 151, Issue 5, pp. F98-F104.

Kukli K. et al., Hafnium silicon oxide films prepared by atomic layer deposition, Materials Science and Engineering B, Elsevier Sequoia, Jun. 15, 2004, vol. 109, Issue 1-3, pp. 2-5, Lausanne, CH.

Kwon et al., Ruthenium Bottom Electrode Prepared by Electroplating for a High Density DRAM Capacitor, J. Electrochem. Soc., 2004, vol. 151, Issue 2, pp. C127-C132.

Lai et al., Precursors for Organometallic Chemical Vapor Deposition of Tungsten Carbide Films, Chem. Mater, 1995, vol. 7, pp. 2284-2292.

Leskela et al., Atomic Layer Epitaxy in Deposition of Various Oxide and Nitride Thin Films, Journal De Physique IV, Colloque C5, Supplement au Journal de Physique II, Jun. 1995, vol. 5.

Lin et al., An Adjustable Work Function Technology Using Mo Gate for CMOS Devices, IEEE Electron Dev. Lett., 2002, vol. 23, Issue 1, pp. 49-51.

Liu et al., Metal Nanocrystal Memories—Part I: Device Design and Fabrication, IEEE Transactions on Electron Devices, 2002, vol. 49, Issue 9, pp. 1606-1613.

Liu et al., Metal Nanocrystal Memories—Part II: Electrical Characteristics, IEEE Transactions on Electron Devices, 2002, vol. 49, Issue 9, pp. 1614-1622.

Lu et al., Metal Gate Work Function Adjustment for Future CMOS Technology, VLSI Technology Digest of Technical Papers, 2001, pp. 45-46.

Lucovsky, Integration of Alternative High-K Gate Dielectrics into Aggressively Scaled CMOS Si Devices: Chemical Bonding Constraints at Si-Dielectric Interfaces, Electrochemical Society Proceedings, 1999, vol. 99-10, pp. 69-80.

Maiti et al., PVD TiN Metal Gate MOSFETs on Bulk Silicon and Fully Depleted Silicon-On-Insulator (FDSOI) Substrates for Deep Sub-Quarter Micron CMOS Technology, IEEE, IEDM, 0-7803-4774-9/98, 1998, Issue 781-784.

Martensson et al., Use of Atomic Layer Epitaxy for Fabrication of Si/TiN/Cu Structures, J.Vac Sci. Technol. B, Sep./Oct. 1999, vol. 17, Issue 5, pp. 2122-2128.

Michaelson, H. B., The Work Function of the Elements and its Periodicity, J. Appl. Phys., 1977, vol. 48, Issue 11, pp. 4729-4733.

Min et al., Atomic Layer Deposition of TiN Films by Alternate Supply of Tetrakis (ethylmethylannino)-Titatiunn and Ammonia, Jpn. J. Appl. Phys., 1998, vol. 37, pp. 4999-5004.

Min et al., Atomic Layer Deposition of TiN Thin Films by Sequential Introduction of Ti precursor and $Nh_3$, Mat. Res. Soc. Symp. Proc., 1998, vol. 514, pp. 337-342.

Min et al., The Mechanism of Si Incorporation and the Digital Control of Si Content during the Metallorganic Atomic Layer Deposition of Ti—Si—N Thin Films, J. Electrochem. Soc., 2000, vol. 147, Issue 10, pp. 3868-3872.

Nakajima et al., Chemical Vapor Deposition of Tungsten Carbide, Molybdenum Carbide Nitride, and Molybdenum Nitride Films, J. Electrochem. Soc., Jun. 1997.

Nakajima et al., Atomic-layer-deposited silicon—nitride/$SiO_2$ stacked gate dielectrics for highly reliable p-metal-oxide-semiconductor filed-effect transistors, Applied Physics Letters, 2000, vol. 77, Issue 18, pp. 2855-2857.

Nakajima et al., Low-temperature formation of silicon nitride gate dielectrics by atomic-layer deposition, Applied Physics Letters, 2001, vol. 79, Issue 5, pp. 665-667.

Niinisto et al., Synthesis of Oxide Thin Films and Overlayers by Atomic Layer Epitaxy for Advanced Applications, Materials Science and Engineering, 1996, vol. B41, pp. 23-29.

Park et al., Robust Ternary Metal Gate Electrodes for Dual Gate CMOS Devices, IEEE, IEDM, 0-7803-7050-3/02, 2001, pp. 671-674.

Parsons et al., Microcontact Patterning of Ruthenium Gate Electrodes by Selective Area, North Carolina State university, presentation at AVS conference on Atomic Layer Deposition (ALD 2004), Aug. 16, 2004, Helsinki, Finland.

Petra Alen, Atomic Layer Deposition of TaN, NbN, and MoN Films for Cu Metallizations, Academic Dissertation, Jun. 22, 2005, Helsinki, Finland.

Polishchuk, Dual Work Function Metal Gate CMOS Technology Using Metal Interdiffusion, IEEE Electron Device Letters, 2001, vol. 22, Issue 9, pp. 444-446.

Ritala et al., Controlled Growth of TaN, $Ta_3N_5$, and $TaO_xN_y$ Thin Films by Atomic Layer Deposition, J. Chem. Mater., 1999, vol. 11, pp. 1712-1718.

Ritala et al., Atomic Layer Epitaxy Growth of tiN Thin Films from $TiI_4$ and $NH_3$, J. Electrochemical Soc., Aug. 1, 1998.

Ritala et al., Perfectly Conformal TiN and $Al_2O_3$ Films Deposited by Atomic Layer Deposition, Communications, Chemical Vapor Deposition, 1999, vol. 5, Issue 1, pp. 7-9.

Ritala et al., Zirconium Dioxide Thin Films Deposited by ALE Using Zirconium Tetrachloride as Precursor, Applied Surface Science, 1994, vol. 75, pp. 333-340.

Sakaue et al., Digital Chemical Vapor Deposition of $SiO_2$ Using a Repetitive Reaction of TriethylsilanelHydrogen and Oxidation, Japanese Journal of Applied Physics, Jan. 1, 1990, vol. 30, Issue 1B, pp. L124-L127.

Schumacher et al., Integration of ALD WCN Into a Dual Damascene Oxide Module.

Shimamoto et al., 2005 Symposium on Vlsi Technology Digest of Technical Papers, pp. 132-133.

Singer, Atomic Layer Deposition Targets Thin Films, Semiconductor International, Sep. 1, 1999, pp. 1 page.

Sneh et al., Atomic Layer Growth of $SiO_2$ on Si(100) Using $SiCl_4$ and $H_2O$ in a Binary Reaction Sequence, Surface Science, 1995, vol. 334, pp. 135-152.

Suntola, Atomic Layer Epitaxy, Handbook of Crystal Growth, 1994, vol. 3, pp. 601-663.

Tiita et al., Phosphorus-Doped Alumina, vol. 33, Issue 9, pp. 1319-1323.

Tiita et al., Preparation and Characterization of Phosphorus-Doped Aluminum Oxide Thin Films, Materials Research Bulletin, 1998, vol. 33, Issue 9, pp. 1315-1323.

Vehkamaki et al., Growth of $SrTiO_3$ and $BaTiO_3$ Thin Films by Atomic Layer Deposition, Department of Chemistry. University of Helsinki. FIN-00014, Electronic and Solid State Letters, Letters Online, 1999, vol. 2, Issue 10, Helsinki, Finland.

(56) References Cited

OTHER PUBLICATIONS

Wakabayashi et al., A Novel W/TiNx Metal Gate CMOS Technology using Nitrogren-Concentration-Controlling TiNx Film, IEEE, IEDM, 0-7803-5410-9/99, 1999, vol. 253-256.

Wilk et al., High-k dielectrics: Current status and materials properties considerations, Journal of Applied Physics, 2001, vol. 89, Issue 10, pp. 5243-5275.

Wise et al., Diethyldiethoxysilane as a New Precursor for $SiO_2$ Growth of Silicon, Mat. Res. Soc. Symp. Proc., vol. 334, pp. 37-43.

Yagishita et al., High Performance Damascene Metal Gate MOSFET's for 0.1 □m Regime, IEEE Transactions on Electron Devices, 2000, vol. 47, Issue 5, pp. 1028-1034.

Yagishita et al., Reduction of Threshold Voltage Deviation in Damascene Metal Gate MOSFETs, IEEE, IEDM, 0-7083-5410-9/99, 1999, pp. 257-260.

Yeo et al., Dual-Metal Gate CMOS Technology with Ultrathin Silicon Nitride Gate Dielectric, IEEE Electronic Device Letters, 2001, vol. 22, Issue 5, pp. 227-229.

Zhong et al., Electrical Properties of $RuO_2$ Gate Electrodes for Dual Metal Gate Si-CMOS, IEEE Electron Device Letters, 2000, vol. 21, Issue 12, pp. 593-595.

Zhong et al., Characterization of $RuO_2$ Electrodes on Zr Silicate and $ZrO_2$ Dielectrics, Appl. Phys. Lett., 2001, vol. 78, Issue 8, pp. 1134-1136.

* cited by examiner

DOPING WITH ALD TECHNOLOGY

CROSS-REFERENCE TO RELATED APPLICATIONS

The present application is related to U.S. patent application Ser. No. 11/294,843, filed on Dec. 5, 2005, U.S. patent application Ser. No. 11/414,510, filed on Apr. 28, 2006, U.S. patent application Ser. No. 11/868,333, filed on Oct. 10, 2007, and U.S. patent application Ser. No. 09/800,757, filed on Mar. 6, 2001, now U.S. Pat. No. 6,534,395. The entirety of each of the above referenced applications is incorporated herein by reference and made part of this specification.

BACKGROUND OF THE INVENTION

1. Field of the Invention

The present disclosure relates to doping a surface of a thin film or the interface between two thin films by atomic layer deposition. In particular, the disclosure concerns atomic layer deposition methods that utilize a blocking reactant to provide for uniform doping of a substrate at a desired level.

2. Description of the Related Art

In semiconductor device applications, dopants are often intentionally introduced at various locations of the device structure in order to modulate device performance. Area density of the dopant is important to achieve the desired effect and performance. In the past, element addition, or doping, was customarily achieved by utilizing conventional thermal diffusion in furnace, ion-implantation and Chemical or Physical Vapor Deposition (CVD, PVD), such as sputtering. It is extremely difficult, however, to achieve uniform doping across a large substrate due to dose variation. In addition, it is difficult to control the doping profile. Atomic Layer Deposition (ALD) processes, as described herein, are a practical alternative to uniformly controlling doping across a large substrate, and allow for control of the area density of dopant at desired locations.

Traditional ALD is a self-limiting process, whereby alternated pulses of reaction precursors saturate a substrate surface and leave no more than one monolayer of material per pulse. The deposition conditions and precursors are typically selected to ensure self-saturating reactions, such that an adsorbed layer in one pulse leaves a surface termination that is non-reactive with the additional gas phase reactants of the same pulse. A subsequent pulse of different reactants reacts with the previous termination to enable continued deposition. Thus each cycle of alternated pulses leaves no more than about one molecular layer of the desired material. The principles of ALD type processes have been presented, for example, by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD process for depositing thin films, one deposition cycle comprises exposing the substrate to a first reactant, removing unreacted first reactant and reaction byproducts from the reaction chamber, exposing the substrate to a second reactant, followed by a second removal step.

In previous ALD methods that could be used for doping, dopant uniformity could be obtained through saturating binding sites on the surface with a dopant precursor reactant. However, dopant levels would thus be determined by the number of available binding sites. While a lower dopant concentration could theoretically be obtained through a non-saturated doping reaction by using a limited amount of precursor, such a process would lead to non-uniformity of dopant across the substrate, particularly in a cross flow type reactor.

SUMMARY OF THE INVENTION

According to some embodiments of the invention, an atomic layer deposition (ALD) process for doping the surface of a substrate is provided. According to other embodiments of the invention, an ALD process for doping the interface between two thin films on a substrate is provided. In some embodiments the ALD process generally comprises providing a substrate to a reaction space and depositing a dopant on the substrate in a single ALD cycle in which the substrate is contacted with a first reactant that is a blocking reactant such that the blocking reactant adsorbs in a self-limiting manner on the surface of the substrate. Excess blocking reactant is removed from the reaction space and the substrate is contacted with a second reactant that is a dopant precursor such that the dopant precursor adsorbs in a self limiting manner on the surface substrate at the available binding sites. Excess dopant precursor is then removed. In some embodiments, the substrate is contacted with a third reactant that reacts with the dopant precursor to form the desired dopant. In other embodiments, a third reactant is not used, for example, if the dopant precursor itself serves as the dopant. A thin film may be subsequently deposited over the substrate.

In other embodiments, the blocking reactant and the dopant precursor are provided simultaneously and compete for available binding sites on the substrate surface. Again, a third reactant may be provided subsequently to convert the blocking reactant and/or the dopant precursor to the desired form.

The blocking reactant and dopant precursor are selected such that a desired concentration of dopant is deposited on the substrate.

According to some embodiments, an ALD process is used for doping an interface between two thin films, such as a gate dielectric layer and a gate electrode.

BRIEF DESCRIPTION OF THE DRAWINGS

The invention may be better understood from the Detailed Description and from the appended drawings, which are meant to illustrate and not to limit the invention.

DETAILED DESCRIPTION

Figure 1:
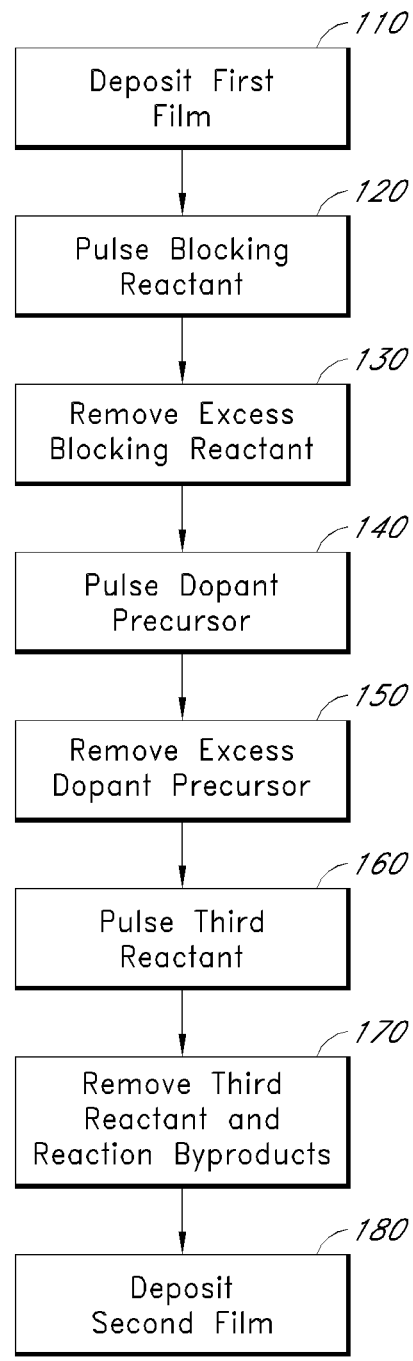
FIG. 1 is a flow chart schematically illustrating methods for depositing a dopant at a desired concentration by providing multiple reactants sequentially in an ALD process.

Atomic layer deposition methods for depositing a dopant on a substrate while controlling the concentration of the dopant are provided. In situations where the saturating level of binding of a reactant comprising the dopant would produce a concentration of dopant greater than desired, subsaturating level of incorporation, or a submonolayer, can be achieved by blocking a portion of the available reaction sites with one or more additional reactants (blocking reactants).

For example, it can be desirable to dope the interface between a dielectric layer, such as silicon oxide or silicon oxynitride, and an overlying gate electrode with a metal, such as hafnium in order to influence the work function (Shimamoto et al. 2005 Symposium on VLSI Technology Digest of Technical Papers, pp. 132-133). In a typical ALD process where a silicon oxide surface is contacted with $HfCl_4$, a saturating amount of $HfCl_4$ adsorbs on the surface. This saturating dose provides a minimum of about $4\ e^{14}$ atoms/cm² Hf atoms following reduction with $H_2O$. However, in some situations the desired concentration of Hf atoms to achieve the preferred electrical properties is approximately 4 times lower (in the range of $1\ e^{14}$ atoms/cm²). While a subsaturating dose of $HfCl_4$ could theoretically be used to reduce the concentration of Hf that is adsorbed, it is not currently possible to achieve adequate uniformity with subsaturating doses.

The inventors recognized that by controlling the number of available reaction sites on a substrate surface, a uniform dopant concentration in a desired range can be obtained, typically in one reaction cycle. Two or more reactants are provided to a reaction space, one of which is the reactant comprising the dopant and the other of which is a blocking reactant that blocks enough of the available reaction sites for the dopant precursor to achieve the desired dopant concentration.

The reactants may be provided either sequentially, with the blocking reactant provided first to limit the number of available binding sites for the dopant precursor, or simultaneously, such that the blocking reactant and dopant precursor compete for binding at available surface sites. In some embodiments, the blocking reactant functions to block the dopant precursor from accessing and reacting with the surface sites. In other embodiments, the blocking reactant functions by consuming available surface sites so that the surface sites are no longer available to the dopant precursor. Exemplary embodiments which will be developed in more detail include the use of metal reactants as the dopant precursor and silicon or metal reactants as the blocking reactant.

In the example of doping the interface between a gate dielectric and a gate electrode with Hf described above, the level of saturating binding of $HfCl_4$ can be reduced by sequentially or simultaneously contacting the substrate with a blocking reactant such as trimethyl aluminum (TMA) and the dopant reactant, $HfCl_4$. The blocking reactant reduces the number of available reaction sites for $HfCl_4$ and thus reduces the amount of saturative binding of $HfCl_4$ and ultimately reduces the surface incorporation of the Hf dopant to the desired level. Although generally illustrated in terms of doping the interface between a gate dielectric and an overlying gate electrode, the skilled artisan will appreciate that the methods disclosed herein can be applied in many different contexts, such as for an interface dipole formation between a gate dielectric and an interfacial oxide in a CMOS application, as a barrier height tuning in non-volatile devices, or in any other devices or applications in which a sub-atomic layer of dopant is required.

Deposition of the dopant is carried out in a reaction space, which is typically a volume in a reactor in which conditions can be adjusted to effect film growth by ALD processes. The reaction space can include surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. In addition, chemical vapor deposition reactors can be adapted for use in the methods. The reactor can be configured for plasma generation, either in situ or remote. An exemplary reactor is the Pulsar™ cross-flow reactor available from ASM America (Phoenix, Ariz.).

The substrate is typically a workpiece on which deposition is desired and can include for example and without limitation, silicon, silica, coated silicon, metal, such as copper or aluminum, dielectric materials, nitrides, and/or combinations of materials. The substrate surface is a boundary between the reaction space and a feature of the substrate. Geometrically challenging applications, such as doping the surface of high aspect-ratio features (e.g., vias and trenches) are possible due to the self-limiting nature of the surface reactions.

In some applications, it may be desirable to have a fixed quantity of a dopant, such as a metal, at an interface between two films, for example between a gate dielectric and a gate electrode. According to some embodiments, a film, such as a metal or metal silicate film, is deposited on a substrate, such as an integrated circuit (IC) workpiece. The film may be deposited by ALD or another deposition method. A dopant is subsequently provided on the surface of the film in a desired concentration range, using an ALD process as described below. In some embodiments the dopant is deposited in situ; that is, in the same reaction space in which the film was deposited. In other embodiments, the substrate is moved to a different reaction chamber for deposition of the dopant. A second film is deposited over the dopant, such that a desired concentration of dopant is present at the interface between the first and second layers.

In some embodiments, ALD processes for doping comprise a single ALD cycle in which a blocking reactant and a dopant precursor are alternately and sequentially provided, as illustrated schematically in FIG. 1. After depositing a first film 110, a blocking reactant is pulsed into the reaction space 120. The blocking reactant may be provided, for example, with the aid of an inert carrier gas, such as Ar, or $N_2$. The blocking reactant is selected such that it adsorbs in a self-limiting manner on the substrate surface that is to be doped. Importantly, the blocking reactant is also selected such that after adsorption, only enough binding sites remain available for a desired concentration of a particular dopant precursor to adsorb on the substrate surface.

After sufficient time to allow the blocking reactant to adsorb on the substrate surface, excess reactant and reaction by-products, if any, are removed from the reaction space 130. This may be accomplished, for example, by purging and/or by evacuating the reaction space with the aid of a vacuum pump. In embodiments where the blocking reactant is provided with the aid of an inert carrier gas, the same gas may be used to purge the reaction space by stopping provision of the blocking reactant into the stream of carrier gas, while continuing to flow the carrier gas.

A dopant precursor is then pulsed into the reaction space 140 where it adsorbs on the substrate surface at the available binding sites. After sufficient time to allow the dopant precursor to adsorb to the substrate surface in a self limiting manner, excess dopant reactant and reaction by-products, if any, are removed from the reaction space 150, such as by purging and/or evacuating the reaction space with the aid of a vacuum pump. Importantly, the dopant precursor is selected such that it does not react with the previously adsorbed blocking reactant, but rather adsorbs at the remaining available binding sites.

As described above with respect to the blocking reactant, the dopant precursor can be provided with the aid of an inert carrier gas and the reaction space can be purged by stopping provision of the dopant precursor while continuing to flow the carrier gas.

Next, a pulse of a third reactant 160, such as $H_2O$, is introduced into the reaction space to remove undesired surface ligands from dopant precursors that are chemically bonded to the substrate. The third reactant may also react with the blocking reactant. The third reactant may be an excited species, such as radicals. In some embodiments, it is not necessary to reduce the dopant precursor and this third reactant is omitted.

The ALD cycle is completed by removing excess third reactant and reaction by-products, if any, from the reaction space 170. Again, this may be accomplished by purging and/or by evacuating the reaction space with the aid of a vacuum pump. If a carrier gas is used to provide the third reactant, the reaction space may be purged by stopping provision of the third reactant while continuing to flow the carrier gas. In some embodiments, the dopant reactant comprises a metal oxide, a nitride, a carbide, or other metal or multi-component compounds. Thus, the third reactant can be an oxidizing, nitriding, carbiding, or other types of reactants. Additional reactants can be used in an ALD cycle to form more complex compounds. Additional reactants can be provided and removed in the same manner as the other reactants as described above. These reactants may be chosen according to the desired reaction and dopant. In some such embodiments, the third reactant may be purged by continuing to flow a source gas in which radicals were generated.

After deposition of the dopant, processing is continued, if desired, for example by depositing a second film onto the substrate 180. Deposition of a second film may be directly over and contacting the dopant. Deposition of a second film may be by an ALD process and may begin, for example, by treating the substrate surface to provide an appropriate surface termination for the new ALD process. The second film may be deposited in situ with deposition of the dopant, or in a different reaction chamber.

Figure 2:
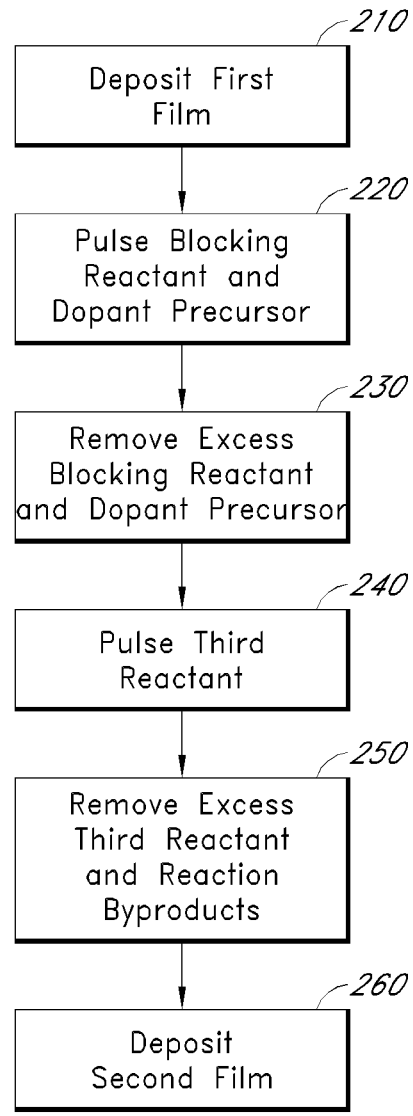
FIG. 2 is a schematic drawing showing a process in which multiple reactants are provided simultaneously in an ALD process to achieve a desired concentration of dopant.

In some embodiments, ALD processes for doping comprise a single ALD cycle in which one or more blocking reactants and a dopant precursor are simultaneously provided, as illustrated schematically in FIG. 2. After depositing a first film, 210, a blocking reactant and a dopant precursor are pulsed into a reaction space 220. The blocking reactant and the dopant precursor may be provided, for example, with the aid of an inert carrier gas, such as Ar or $N_2$. The blocking reactant and the dopant precursor may be selected such that they compete for the same available binding sites on the substrate surface that is to be doped, but do not react with one another, and together achieve the desired concentration of dopant adsorption through saturative binding. In other embodiments, they may be selected such that they do not necessarily compete for the same binding sites, but the blocking reactant reduces binding of the dopant precursor.

After sufficient time to allow the blocking reactant and the dopant precursor to adsorb on the substrate surface, excess reactant, precursor, and reaction by-products, if any, are removed from the reaction space 230. This may be accomplished, for example, by purging and/or by evacuating the reaction space with the aid of a vacuum pump. In embodiments where the blocking reactant and dopant precursor are provided with the aid of an inert carrier gas, the same gas may be used to purge the reaction space by stopping provision of the blocking reactant and the dopant precursor into the stream of carrier gas, while continuing to flow the carrier gas.

Next, a pulse of a third reactant, such as $H_2O$, is introduced into the reaction space to convert the dopant precursor to the desired dopant, if necessary. This may be accomplished, for example, by removing the undesired surface ligands from dopant precursors that are chemically bonded to the substrate to complete the ALD reaction of the dopant precursor 240. In some embodiments, the dopant precursor itself serves as the dopant, and a third reactant is not used. The third reactant may also react with the blocking reactant.

The ALD cycle is completed by removing excess third reactant and reaction by-products, if any, from the reaction space 250. Again, this may be accomplished by purging and/or by evacuating the reaction space with the aid of a vacuum pump. If a carrier gas is used to provide the third reactant, the reaction space may be purged by stopping provision of the third reactant while continuing to flow the carrier gas. In some embodiments, the third reactant may be an excited species, such as radicals. In some embodiments the third reactant may be purged by continuing to flow a source gas in which radicals were generated.

After deposition of the dopant, processing may be continued, if desired, for example by depositing a second film onto the substrate 260. Deposition of a second film may be deposited directly over and contacting the dopant. Deposition of a second film may be by an ALD process and may begin, for example, by treating the substrate surface to provide an appropriate surface termination for the ALD process. The second film may be deposited in situ with the deposition of the dopant, or in a different reaction chamber.

In the preferred embodiments, a single ALD cycle in which the blocking reactant, doping reactant and third reactant are provided, is used to deposit the dopant. However, in some embodiments, additional cycles may be carried out to achieve the desired dopant concentration. For example, one cycle, 2, 3, 4, 5 or 10 cycles may be carried out. In some embodiments, the same blocking reactant is used in each cycle. For other embodiments, the blocking reactant may be varied.

As mentioned above, the reactants may be pulsed with the aid of an inert carrier gas (e.g., $N_2$, He, Ar) or on their own (so-called vapor draw scheme). Excess blocking reactant, doping reactant, reducing reactant, and reaction by-products (if any) are removed from the reaction space, for example with the aid of a purge gas (e.g., $N_2$, He, Ar) and/or a vacuum generated by a pumping system. If the reactants are supplied with the aid of a carrier gas, excess reactants and reaction by-products may be removed by terminating the flow of the reactants and continuing to supply the carrier gas. In this respect, the carrier gas serves as the purge gas.

In preferred embodiments, the dopant precursor is a metal source chemical (also referred to as a metal reactant). For example, the dopant precursor may be a vapor phase species comprising at least one of Ti, Hf, Zr, Si, Al, Ta, Sr, Ba, Sc, Y, La, Eu, and Dy. The dopant precursor is typically selected based on reactivity, vapor pressure and compatibility with the other reactants. In some embodiments, the dopant precursor is a metal halide source chemical. In some embodiments, the dopant precursor is a metal halide. In some particular embodiments the dopant precursor is a Hf halide compound, such as $HfCl_4$.

In preferred embodiments, the blocking reactant can also be a metal source chemical. For example, the metal reactant may be a vapor phase species comprising at least one of Ti, Hf, Zr, Si, Al, Ta, Sr, Ba, Sc, Y, La, Eu, and Dy. The blocking reactants are typically screened and selected based on one or more of the following criteria: 1) the blocking reactants should be suitable as an ALD precursor; 2) the blocking reactants should be thermally and chemically compatible with the dopant precursor in the required pressure and/or temperature range to minimize the incorporation of impurities; 3) the blocking reactants should have the same reactivity as the dopant precursors, for example by reacting with the same oxidizing reactants as the dopant precursors; 4) the blocking reactants should have the ability to modulate the availability of the reaction sites by either blocking (steric hindrance effect) or consuming the reaction sites, however, the reaction sites should not be exhausted by the dopant precursors. Suitable reactants are generally selected such that the saturating level of adsorption of the dopant precursor is limited to a desired level, thereby achieving the desired concentration of dopant. Preferably the blocking reactants are also selected such that they do not introduce undesired elements onto the surface.

Depending on the desired area, the density of dopant, surface reactivity and molecular size of the blocking agent should be compared to the dopant precursor. For example, the relative speed of reaction during competitive binding should be taken into account when choosing a blocking reactant and dopant precursor. As another example, to achieve low dopant level, a faster reactant with a high surface coverage and molecular size is preferred. In some embodiments, the blocking reactant is trimethyl aluminum (TMA).

In some embodiments, the blocking reactant is a silicon halide compound, such as, e.g., $Si_xW_yH_z$, wherein "W" is a halide selected from the group consisting of F, CL, Br and I, "x" and "y" are integers greater than zero, and "z" is an integer greater than or equal to zero. The silicon halide source compound may be selected from the group consisting of silicon fluorides (e.g., $SiF_4$), silicon chlorides (e.g., $SiCl_4$), silicon bromides (e.g., $SiBr_4$), and silicon iodides (e.g., $SiI_4$). In some embodiments, the silicon halide compound is silicon tetrachloride ($SiCl_4$).

It will be appreciated that prior to beginning the ALD process for depositing the dopant, the substrate may be provided with an initial surface termination. As an example, a silicon substrate may be contacted with water to form an OH surface termination on the silicon. The surface termination may, for example, make the surface reactive with one or both of the blocking reactant and dopant precursor.

The blocking reactant is preferably selected such that it does not adversely affect the properties of the structure being formed or of the dopant. Thus, in some embodiments the blocking reactant comprises a component of an underlying or overlying film. For example, if the dopant is being deposited at the interface of a film comprising silicon and another film, such as at the interface between silicon oxide and a gate electrode, the blocking reactant may be a silicon source chemical (also referred to as "silicon source material" herein). In other embodiments the blocking reactant may comprise a metal that is present in an underlying or overlying film.

In some embodiments, the blocking reactant is the same as the precursor used in an ALD process to deposit the underlying layer, such as a Si compound that was used to deposit an underlying SiO or SiON layer. Thus, in some embodiments after depositing an underlying layer by ALD, the doping ALD process can be carried out in the same reaction space and, in some cases, using at lease one of the precursors used in the prior deposition. In some embodiments, an overlying layer can be deposited by ALD or another deposition method in the same reaction space as the doping process.

Example 1

Figure 3:
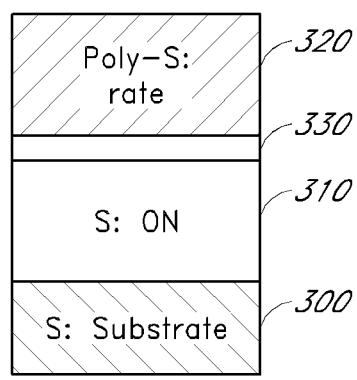
FIG. 3 is a schematic illustration of a gate electrode structure with an interface doped by methods disclosed herein.

Hf was used to dope the interface between a film of SiON and a gate electrode. The structure is illustrated in FIG. 3. A SiON film 310 was deposited on a silicon substrate 300 in a CVD reactor. Following the SiON deposition, the reaction chamber was purged and the substrate was alternately and sequentially contacted with $HfCl_4$ trimethyl aluminum (TMA), and $H_2O$ in the following ALD cycle:

| Reactant | Pulse time |
|---|---|
| $HfCl_4$ | 1000 ms |
| Purge | 3000 ms |
| TMA | 500 ms |
| Purge | 3000 ms |
| $H_2O$ | 500 ms |
| Purge | 3000 ms |

The deposition cycle provided a Hf concentration of approximately $1\times10^{14}$ Hf atoms/cm2 on the surface of the SiON film. A poly-silicon gate 320 was then formed over the substrate surface such that the Hf—Al dopant layer formed an interface 330 between the poly-silicon gate structure and the SiON film with the desired concentration of Hf.

Example 2

A SiON film is deposited on a silicon substrate. A sub-monolayer of hafnium is deposited on the SiON film by a single ALD cycle in which the substrate is contacted simultaneously with trimethyl aluminum (TMA) and $HfCl_4$. After sufficient time to allow the reactants to adsorb to the substrate surface, the reaction space is purged and the substrate is contacted with $H_2O$. The purge and pulse times for the ALD cycle are:

| Reactant | Pulse time |
|---|---|
| TMA and HfCl4 | 500 ms |
| Purge | 3000 ms |
| $H_2O$ | 500 ms |
| Purge | 3000 ms |

After the ALD cycle is completed, a poly-silicon gate is deposited over the substrate surface such that the interface between the poly-silicon gate structure and the SiON film has a Hf concentration of approximately $1\times10^{14}$ Hf atoms/cm$^2$.

Example 3

Hf was used to dope the interface between a film of SiON and a gate electrode. The structure is illustrated in FIG. 3. A SiON film 310 was deposited on a silicon substrate 300 in a reactor. Following the SiON deposition, the reaction chamber was purged and the substrate was alternately and sequentially contacted with $SiCl_4$, $HfCl_4$ and $H_2O$ in the following ALD cycle:

| Reactant | Pulse time |
|---|---|
| $SiCl_4$ | 100 ms |
| Purge | 3000 ms |
| $HfCl_4$ | 500 ms |
| Purge | 3000 ms |
| $H_2O$ | 500 ms |
| Purge | 3000 ms |

The deposition cycle provided a Hf concentration of approximately $1\times10^{14}$ Hf atoms/cm$^2$ on the surface of the SiON film. A poly-silicon gate 320 was then formed over the substrate surface such that the Hf—Al dopant layer formed an interface 330 between the poly-silicon gate structure and the SiON film with the desired concentration of Hf.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A method for doping the interface between two films on a substrate with a sub-monolayer of dopant comprising:
   providing a substrate comprising a first dielectric film having an upper surface;
   depositing a sub-monolayer of dopant on the upper surface of the first dielectric film by one single atomic layer deposition cycle comprising:
      contacting the substrate with a first reactant that is a blocking reactant such that the blocking reactant adsorbs in a self-limiting manner on the first film;
      removing excess blocking reactant from the reaction space;
      after removing excess blocking reactant, contacting the substrate with a second reactant that is a dopant precursor such that the dopant precursor adsorbs in a self limiting manner on the surface of the first film;
      removing excess dopant precursor; and
      contacting the substrate with a third reactant that reacts with the dopant precursor to form the sub-monolayer of dopant on the first film; and
   after the one atomic layer deposition cycle, subsequently depositing a second, different, conductive thin film directly over the sub-monolayer of dopant, wherein the dopant is not present in the dielectric layer; and
   wherein the blocking reactant is trimethyl aluminum.

2. The method of claim 1, wherein the dopant precursor is a metal source chemical.

3. The method of claim 2, wherein the metal source chemical is a transition metal source chemical.

4. The method of claim 3, wherein the metal source chemical comprises a metal selected from the group consisting of Ti, Hf, Zr, Si, Al, Ta, Sr, Ba, Sc, Y, La, Eu, and Dy.

5. The method of claim 4, wherein the metal source chemical is a hafnium halide.

6. The method of claim 5, wherein the metal halide source chemical is $HfCl_4$.

7. The method of claim 4, wherein the metal source chemical is a zirconium halide.

8. The method of claim 7, wherein the metal source chemical is $ZrCl_4$.

9. The method of claim 1, wherein the third reactant is selected from the group consisting of $H_2O$, $O_3$, O radicals, $H_2O_2$ and $D_2O$.

10. The method of claim 1, further comprising providing an initial surface termination on the upper surface of the dielectric layer prior to contacting the substrate with the blocking reactant.

11. The method of claim 1, wherein the substrate is contacted with the blocking reactant multiple times prior to being contacted with the dopant precursor.

12. A method for doping the interface between two films on a substrate with a sub-monolayer of dopant comprising:
   providing a substrate comprising a first dielectric film having an upper surface;
   depositing a sub-monolayer of dopant on the upper surface of the first dielectric film by one single atomic layer deposition cycle comprising:
      contacting the substrate with a first reactant that is a blocking reactant such that the blocking reactant adsorbs in a self-limiting manner on the first film;
      removing excess blocking reactant from the reaction space;
      after removing excess blocking reactant, contacting the substrate with a second reactant that is a dopant precursor such that the dopant precursor adsorbs in a self limiting manner on the surface of the first film;
      removing excess dopant precursor; and
      contacting the substrate with a third reactant that reacts with the dopant precursor to form the sub-monolayer of dopant on the first film; and
   after the one atomic layer deposition cycle, subsequently depositing a second, different, conductive thin film directly over the sub-monolayer of dopant, wherein the dopant is not present in the dielectric layer,
   wherein the blocking reactant is a silicon source chemical.

13. The method of claim 12, wherein the silicon source chemical is a silicon halide.

14. The method of claim 13, wherein the silicon source chemical is $SiCl_4$.

15. The method of claim 12, wherein the third reactant is selected from the group consisting of $H_2O$, $O_3$, O radicals, $H_2O_2$ and $D_2O$.

16. The method of claim 12, further comprising providing an initial surface termination on the upper surface of the dielectric layer prior to contacting the substrate with the blocking reactant.

17. The method of claim 12, wherein the substrate is contacted with the blocking reactant multiple times prior to being contacted with the dopant precursor.

18. A method for doping an interface between a dielectric thin film and a gate electrode comprising:
   depositing a dielectric thin film on a substrate in a reaction space by a first deposition process;
   depositing hafnium on the surface of the dielectric thin film by one cycle of a single-cycle atomic layer deposition process that is different from the first deposition process; and
   after depositing the hafnium depositing a gate electrode by a different process directly over and contacting the hafnium, wherein the single-cycle ALD process comprises:
      contacting the dielectric thin film with a blocking reactant such that the blocking reactant adsorbs in a self-limiting manner on the surface of the dielectric thin film;
      removing excess blocking reactant from the reaction space;
      after removing excess blocking reactant contacting the dielectric thin film with a dopant precursor comprising Hf such that the dopant precursor adsorbs in a self limiting manner on the surface of the dielectric thin film; and
      removing excess dopant precursor;
   wherein the blocking reactant comprises trimethyl-aluminum (TMA).

19. The method of claim 18, wherein the dielectric thin film comprises SiON.

20. The method of claim 18, wherein the dopant precursor comprises $HfCl_4$.

21. The method of claim 18, further comprising contacting the dielectric thin film with a third reactant that reacts with the dopant precursor to form Hf.

22. The method of claim 18, wherein the third reactant is selected from the group consisting of $H_2O$, $O_3$, O radical, $H_2O_2$ and $D_2O$.

23. The method of claim 18, wherein the gate electrode comprises poly-silicon.

24. The method of claim 18, the single-cycle ALD process further comprises contacting the dielectric film with a third reactant and the concentration of the Hf on the surface of the dielectric film is about $1\times10^{14}$ atoms/cm$^2$.

25. A method for doping an interface between a dielectric thin film and a gate electrode comprising:
    depositing a dielectric thin film on a substrate in a reaction space by a first deposition process;
    depositing hafnium on the surface of the dielectric thin film by one cycle of a single-cycle atomic layer deposition process that is different from the first deposition process; and
    after depositing the hafnium depositing a gate electrode by a different process directly over and contacting the hafnium, wherein the single-cycle ALD process comprises:
    contacting the dielectric thin film with a blocking reactant such that the blocking reactant adsorbs in a self-limiting manner on the surface of the dielectric thin film;
    removing excess blocking reactant from the reaction space;
    after removing excess blocking reactant contacting the dielectric thin film with a dopant precursor comprising Hf such that the dopant precursor adsorbs in a self limiting manner on the surface of the dielectric thin film; and
    removing excess dopant precursor,
    wherein the blocking reactant comprises Si.

26. The method of claim 25, wherein the blocking reactant comprises a silicon halide compound.

27. The method of claim 26, wherein the silicon halide compound is selected from the group consisting of $SiF_4$, $SiCl_4$, $SiBr_4$, and $SiI_4$.

28. The method of claim 25, further comprising contacting the dielectric thin film with a third reactant that reacts with the dopant precursor to form Hf.

29. The method of claim 25, wherein the third reactant is selected from the group consisting of $H_2O$, $O_3$, O radical, $H_2O_2$ and $D_2O$.

30. The method of claim 25, wherein the gate electrode comprises poly-silicon.

* * * * *